United States Patent
Venkatesh et al.

(10) Patent No.: US 6,269,026 B1
(45) Date of Patent: Jul. 31, 2001

(54) CHARGE SHARING TO HELP BOOST THE WORDLINES DURING APDE VERIFY

(75) Inventors: Bhimachar Venkatesh, Cupertino; Edward V. Bautista, Jr., Santa Clara, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/547,747

(22) Filed: Apr. 12, 2000

Related U.S. Application Data

(60) Provisional application No. 60/185,645, filed on Feb. 29, 2000.

(51) Int. Cl.[7] .................................................. G11C 16/04
(52) U.S. Cl. .................................... 365/185.29; 365/185.3
(58) Field of Search ........................... 365/185.29, 185.3, 365/185.22, 185.23, 185.24, 185.33

(56) References Cited

U.S. PATENT DOCUMENTS

| | | | |
|---|---|---|---|
| 5,587,951 | * 12/1996 | Jazayeri et al. | 365/203 |
| 5,650,966 | * 7/1997 | Cleveland et al. | 365/185.3 |
| 5,864,504 | * 1/1999 | Tanzawa et al. | 365/185.24 |
| 6,026,023 | * 2/2000 | Tonda | 365/185.2 |

* cited by examiner

Primary Examiner—Vu A. Le
Assistant Examiner—Anh Phung
(74) Attorney, Agent, or Firm—Wagner, Murabito & Hao LLP

(57) ABSTRACT

The present invention discloses a method of providing a voltage to a plurality of wordlines during the Automatic Program Disturb Erase Verify (APDEV) operation in a memory device. During the APDEV operation, the voltage is supplied to the wordlines sequentially from two energy sources; a charge share circuit and a temperature compensated bias generator circuit. The respective voltages from the two energy sources are applied to the wordlines to charge the wordlines to a bias voltage. The bias voltage is the appropriate voltage on the wordlines to allow the memory device to verify that the bitline current flow is not excessive in the erased memory sector at the present operating temperature of the memory device. The amount of voltage needed to create the bias voltage is dependent on the operating temperature of the memory device.

20 Claims, 5 Drawing Sheets

CHARGE SHARING TO HELP BOOST THE WORDLINES DURING APDE VERIFY

This application claims the benefit under 35 U.S.C. §119(e) of Provisional U.S. patent application Ser. No. 60/185,645, filed on Feb. 29, 2000.

FIELD OF THE INVENTION

The present invention relates generally to non-volatile memory devices and, more particularly, to a method for charging wordlines in flash electrically erasable programmable read-only memory (flash EEPROM) devices.

BACKGROUND OF THE INVENTION

A flash memory is a storage device that is capable of retaining stored information in the absence of continuous power. The information is stored in a plurality of flash transistors that are electrically connected and formed on a silicon substrate. A flash transistor is typically referred to as a cell and includes a source, a drain, a floating gate and a control gate. Flash memory devices are formed by rows and columns of flash transistors that form a flash transistor array. As known in the art, the control gates of the cells are electrically connected with a respective wordline and the drains of the cells are electrically connected with a respective bitline. The source of each cell is electrically connected with a common source line.

The information stored in each particular cell represents a binary one or zero, as known in the art. To perform a program, read or erase operation of a particular cell in the array, a respective voltage is applied to a predetermined wordline, bitline and source line. By applying the voltages to a select bitline column and a select wordline row, an individual cell can be read or programmed.

To program a respective cell, the control gate and the drain of the cell are raised to respective predetermined programming voltages and the source is grounded. When the programming voltages are placed on the control gate and the drain, hot electrons are generated that are injected onto the floating gate where they are trapped forming a negative charge. This electron transfer mechanism is often referred to as Channel Hot Electron (CHE) injection in the semiconductor industry. When the programming voltages are removed, the negative charge on the floating gate is maintained, thereby raising the threshold voltage of the cell. The threshold voltage is used when the cell is read to determine if it is in a charged (programmed) or an uncharged (un-programmed) state.

Cells are read by applying a predetermined voltage to the control gate and the drain, grounding the source of the cell and then sensing the current in the bitline. If the cell is programmed, the threshold voltage will be relatively high and the bitline current will be zero or at least relatively low when a read voltage is applied between the control gate and the source of the cell. If the cell is erased, the threshold voltage will be relatively low and the bitline current will be relatively high when the same read voltage is applied.

In contrast to the programming procedure, flash memory devices are typically bulk-erased, so that all of the cells in a memory sector are simultaneously erased. A memory sector describes the number of wordlines and bitlines in the array and can be formed to include 512 wordlines and 1024 bitlines in a 64-kbyte array. Erasing memory sectors can be performed in several ways involving the application of a set of predetermined voltages to the common source line, the bitlines and the wordlines. This causes electron tunneling from the floating gate to the source through Fowler-Nordheim (F-N) tunneling, which removes the negative charge from the floating gate of the cells in the memory sector.

Cells are typically erased by application of an erase pulse to the memory sector targeted for erasure for a predetermined time. Ideally, each cell in the memory sector requires the same amount of time to remove electrons from the floating gate. In reality, erase times among the cells within the memory sector vary and some of the cells subjected to the erase pulse may become over-erased. The threshold voltage of an over erased cell is lowered to the point that it can cause excessive leakage current in the bitline. Excessive leakage current can prevent proper reading of the programmed cells in the bitline of the memory sector.

It is known in the art that to correct for excessive leakage current, the bitlines are verified during an Automatic Program Disturb Erase Verify (APDEV) operation that occurs automatically as part of an Automatic Program Disturb Erase (APDE) operation. The APDEV operation verifies that each bitline in a particular sector does not contribute excessive leakage current above a predetermined reference current and takes corrective action if necessary. During the APDEV operation, a bias voltage is applied to all the wordlines in the sector and each bitline in the sector is sequentially sensed for current above the reference current. If the bitline current is above the reference current, a stress operation is performed on all the cells in the bitline. A stress operation is known in the art as a soft program that mainly affects the over-erased cells by raising their threshold voltage. After the stress operation, the bitline current is sensed again and the stress operation is repeated if necessary until the current sensed on the bitline during the APDEV operation is below the reference current.

The time required to perform the APDEV operation is increased by the amount of time required to generate the bias voltage on the wordlines. The wordlines are charged up to the bias voltage and due to their capacitive nature, the time to charge the wordlines is dependent on the magnitude of voltage and current available. Typically, all wordlines in the memory sector are charged to the bias voltage simultaneously during the APDEV operation.

The incorporation of lower supply voltages for flash memory devices creates an undesirable increase in the wordline voltage charge time during the APDEV operation. If the bias voltage required to verify the bitlines during the APDEV operation cannot be reached, the current sensed on the bitlines will not correspond to the reference current and the bitlines may not properly verify. Further, the magnitude of capacitance created by the control gate capacitance of the cells on each wordline adds to the difficulty of maintaining the wordline voltage charge time. Since the APDEV operation typically runs multiple times in order to correct the over-erased cells, the increased wordline charge time during the APDEV operation will be multiplied as well.

For the foregoing reasons, a need exists to provide a way of charging the wordlines in a memory sector to the bias voltage so that the bitlines in a memory sector can be verified during the APDEV operation in the desired time irrespective of the supply voltage or cell size.

SUMMARY OF THE INVENTION

The present invention discloses a flash memory wordline charging architecture that is used to charge a plurality of wordlines to a predetermined bias voltage during an APDEV operation. The preferred flash memory includes a charge share circuit and a temperature compensated bias generator circuit that are electrically connected with at least one pass gate. In addition, the charge share circuit is electrically connected with the temperature compensated bias generator circuit. The pass gates are electrically connected with the wordlines in a respective memory sector of the flash memory. During operation, the charge share circuit and the temperature compensated bias generator circuit provide respective charging voltages that are directed by the pass gates to the wordlines during the APDEV operation.

The present invention further discloses a method of charging wordlines to the predetermined bias voltage during the APDEV operation in the flash memory. During the APDEV operation, the charge share circuit generates a first predetermined voltage that is directed to the wordlines through the pass gates for a first predetermined amount of time. The first predetermined voltage is used to charge the wordlines to a base voltage in a rather short period of time. After the charge share circuit charges the wordlines to the base voltage, the temperature compensated bias generator circuit then generates a second predetermined voltage.

The second predetermined voltage is directed with the pass gates to the wordlines for a second predetermined period of time. The second predetermined voltage is equal to a bias voltage necessary to verify the bitlines in the memory sector at the present operating temperature of the memory device. The second predetermined voltage output is higher than the base voltage already present on the wordlines; therefore, the wordlines are charged above the base voltage to the bias voltage with the second predetermined voltage.

The present invention has many advantages over prior methods of charging wordlines to the bias voltage during the APDEV operation, including the ability to use a low power supply voltage (Vcc), the ability to charge the wordlines quickly, and the ability to operate under large variations in temperature. By providing the first predetermined voltage to charge the wordlines to the base voltage and subsequently applying the second predetermined voltage, the voltage on the wordlines is raised to the bias voltage more quickly. Charging the wordlines to the bias voltage quickly allows timely verification of the bitlines in the memory sector during the APDEV operation.

As previously set forth, presently known methods of creating the bias voltage on the wordlines during the APDEV operation rely solely on the temperature compensated bias generator circuit to charge the wordlines to the bias voltage. With the introduction of low power supply voltages in current flash memory design, the temperature compensated bias voltage circuit is no longer capable of charging the wordlines to the required bias voltage in the time period allotted for the APDEV operation. The present invention overcomes the problems associated with the presently known methods by being capable of providing the required bias voltage to the wordlines in the time allotted for the APDEV operation. By boosting the wordlines to a base voltage with the charge share circuit, the temperature compensated bias generator circuit is readily able to charge the wordlines to the bias voltage necessary to verify the bitlines during the APDEV operation.

These and other features and advantages of the invention will become apparent upon consideration of the following detailed description of the presently preferred embodiments of the invention, viewed in conjunction with the appended drawings.

DETAILED DESCRIPTION OF THE INVENTION

The exemplary embodiments of the present invention are set forth below with reference to specific configurations, and those skilled in the art would recognize that various changes and modifications can be made on the specific configurations while remaining within the scope of the claims. The invention may be used with any type of memory device requiring over erase correction; however, the preferred embodiment of the invention is designed for flash memory. All electrical parameters are given by example and can be modified for use with various memory devices using other electrical parameters. For example, in the preferred embodiment, a supply voltage (Vcc) is considered 3.0 V volts, but could alternatively be 5 V, 1.8 V, or some other supply voltage. As known in the art, if a different supply voltage is chosen, the various operational levels would be modified to accommodate the different supply voltage.

All timing parameters set forth below are given by example only and can also be modified to be used with various memory devices with other timing parameters. For example, in the preferred embodiment, the amount of time allowed for charging the wordlines to the bias voltage during the APDEV operation is 550 nanoseconds, but could alternatively be some other predetermined period of time.

Figure 1:
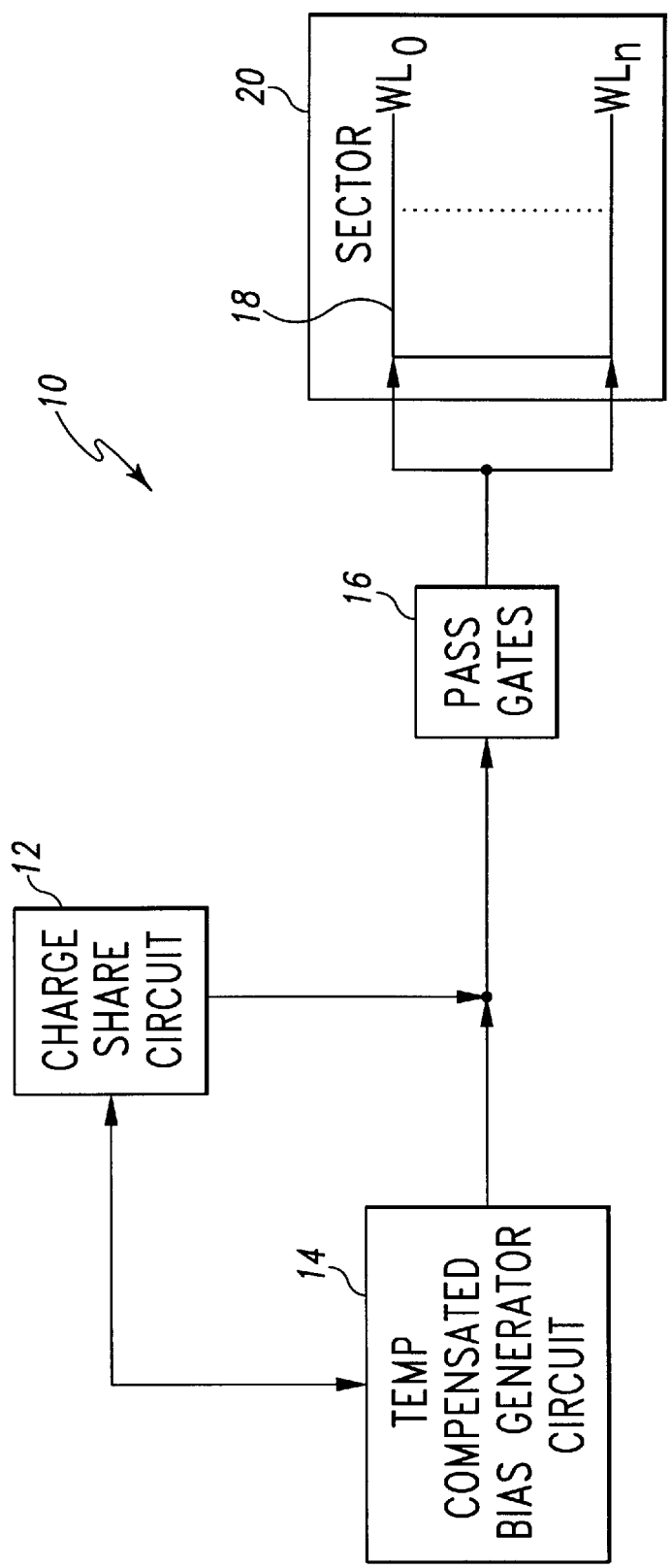
FIG. 1 represents a block diagram of a portion of a preferred flash memory incorporating the presently disclosed invention.

FIG. 1 illustrates a block diagram of a portion of a preferred flash memory 10 that incorporates an embodiment of the present invention. The flash memory 10 includes a charge share circuit 12, a temperature compensated bias generator circuit 14, at least one pass gate 16 and a plurality of wordlines 18 located in a memory sector 20. The output of the charge share circuit 12 and the output of the temperature compensated bias generator circuit 14 are electrically connected with the pass gates 16 of the preferred embodiment. In addition, the charge share circuit 12 is electrically connected with the temperature compensated bias generator circuit 14. The output of the pass gates 16 is electrically connected with the wordline 18 in the memory sector 20. The pass gates 16 are used to direct voltages generated by the charge share circuit 12 and the temperature compensated bias generator circuit 14 to the wordlines 18 during the APDEV operation.

During the APDEV operation, the charge share circuit 12 is used by the flash memory 10 to generate a first predetermined voltage that is directed to the wordlines 18 by the pass gates 16. After a predetermined amount of time, the temperature compensated bias generator circuit 14 is used by the flash memory 10 to generate a second predetermined voltage. The second predetermined voltage is directed to the wordlines 18 through the pass gates 16 during the APDEV operation. The magnitude of the second predetermined voltage is equal to a bias voltage that is based on the operating temperature of the flash memory 10.

During the APDEV operation, the charge share circuit 12 and the temperature compensated bias generator circuit 14 work sequentially to quickly charge the wordlines 18 to the bias voltage. The bias voltage is the magnitude of voltage the wordlines need to be charged to in order to properly verify the bitlines in the memory sector 20 during the APDEV operation at the present operating temperature of the flash memory 10.

Figure 2:
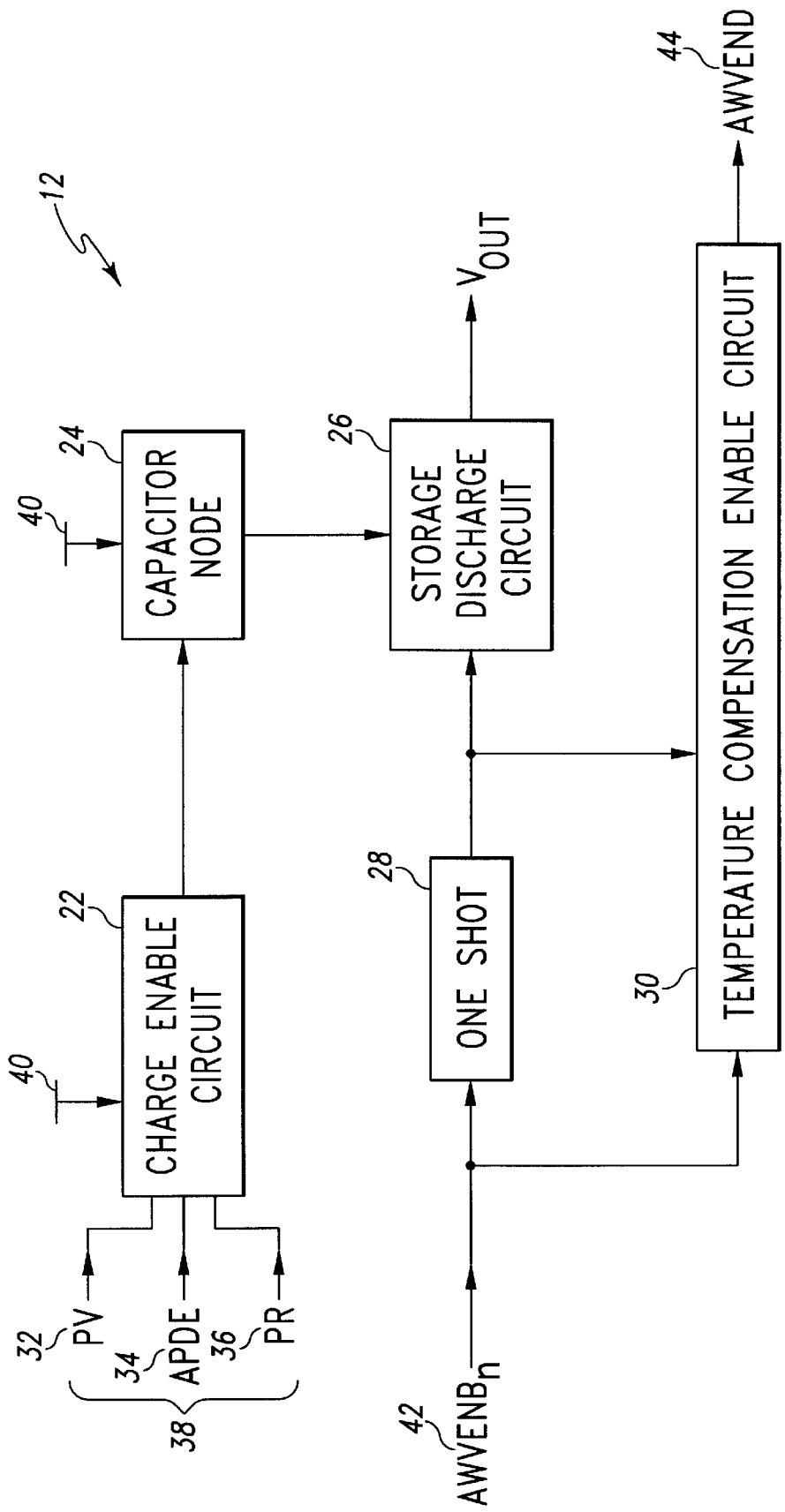
FIG. 2 is a block diagram of a preferred charge share circuit.

Referring to FIG. 2, the charge share circuit 12 includes a charge enable circuit 22, a capacitor node 24, a storage discharge circuit 26, a one shot 28 and a temperature compensation enable circuit 30. A set of control inputs 38 is electrically connected with the charge enable circuit 22 and includes a Program Verify line 32, an Automatic Program Disturb Erase line 34, and a Program Reset line 36. The charge enable circuit 22 is also electrically connected with the capacitor node 24. A regulated power supply 40 is electrically connected with the charge enable circuit 22 and the capacitor node 24 as illustrated.

An AWVENBn line 42, which is electrically connected with the temperature compensated bias generator circuit 14, is electrically connected with the one shot 28 and the temperature compensation enable circuit 30. The output of the one shot 28 is electrically connected with the temperature compensation enable circuit 30 and the storage discharge circuit 26. The storage discharge circuit 26 is also electrically connected with the capacitor node 24. Referring to FIG. 1, the output of the storage discharge circuit 26 is electrically connected with the pass gates 16. The pass gates 16 transfer the voltage generated by the charge share circuit 12 to the wordlines 18 of the respective memory sector 20.

During operation, the charge share circuit 12 is activated in response to predetermined control signals received by the set of control inputs 38, which are generated by a state machine (not shown). As known in the art, the state machine is used to control the overall operation of the flash memory 10 in response to instruction sets that are received by the state machine. In the preferred embodiment, it is only necessary to understand that the state machine generates predetermined control signals during the APDEV operation. The set of control inputs 38 from the state machine initiate and control part of the APDEV operation.

Once activated by the set of control inputs 38, the charge enable circuit 22 sends an electrical signal to the capacitor node 24 that causes the capacitor node 24 to start charging to a first predetermined voltage. After a specified period of time, the capacitor node 24 reaches the first predetermined voltage and the charge enable circuit 22 is directed by the set of control inputs 38 to stop charging the capacitor node 24. In the preferred embodiment, the specified period of time is about 200 nanoseconds. When the capacitor node 24 is no longer being charged, the one shot 28 is enabled by the AWVENBn line 42, thereby causing the one shot 28 to generate an output pulse. The output pulse causes the storage discharge circuit 26 to direct the voltage stored on the capacitor node 24 to the pass gates 16, thereby directing the first predetermined voltage to the wordlines 18 in the memory sector 20.

As previously set forth, while the output pulse of the one shot 28 occurs, the storage discharge circuit 26 directs the first predetermined voltage that is stored in the capacitor node 24 to the pass gates 16 through the storage discharge circuit 26. The pass gates 16 then direct the first predetermined voltage to the wordlines 18 in the memory sector 20 for a first predetermined time period, which is 10 nanoseconds in the preferred embodiment. When the first predetermined voltage is applied to the wordlines 18, the wordlines 18 charge to a predetermined base voltage. This is because the wordlines 18 appear as capacitors in the circuit during the APDEV operation. In the present preferred embodiment, the predetermined base voltage the wordlines 18 are charged to is approximately 230 mV.

While the charge share circuit 12 is charging the wordlines 18 to the base voltage, the temperature compensation enable circuit 30 disables the temperature compensated bias generator circuit 14 with an electrical signal from an AWVEND line 44. After the wordlines 18 are charged to the base voltage, the temperature compensation enable circuit 30 directs a signal through the AWVEND line 44 to a wordline enable circuit 46 of the temperature compensated bias generator circuit 14. The AWVEND line 44 of the temperature compensation enable circuit 30 causes the second predetermined voltage output from the temperature compensated bias generator circuit 14 to be applied to the wordlines 18.

Figure 3:
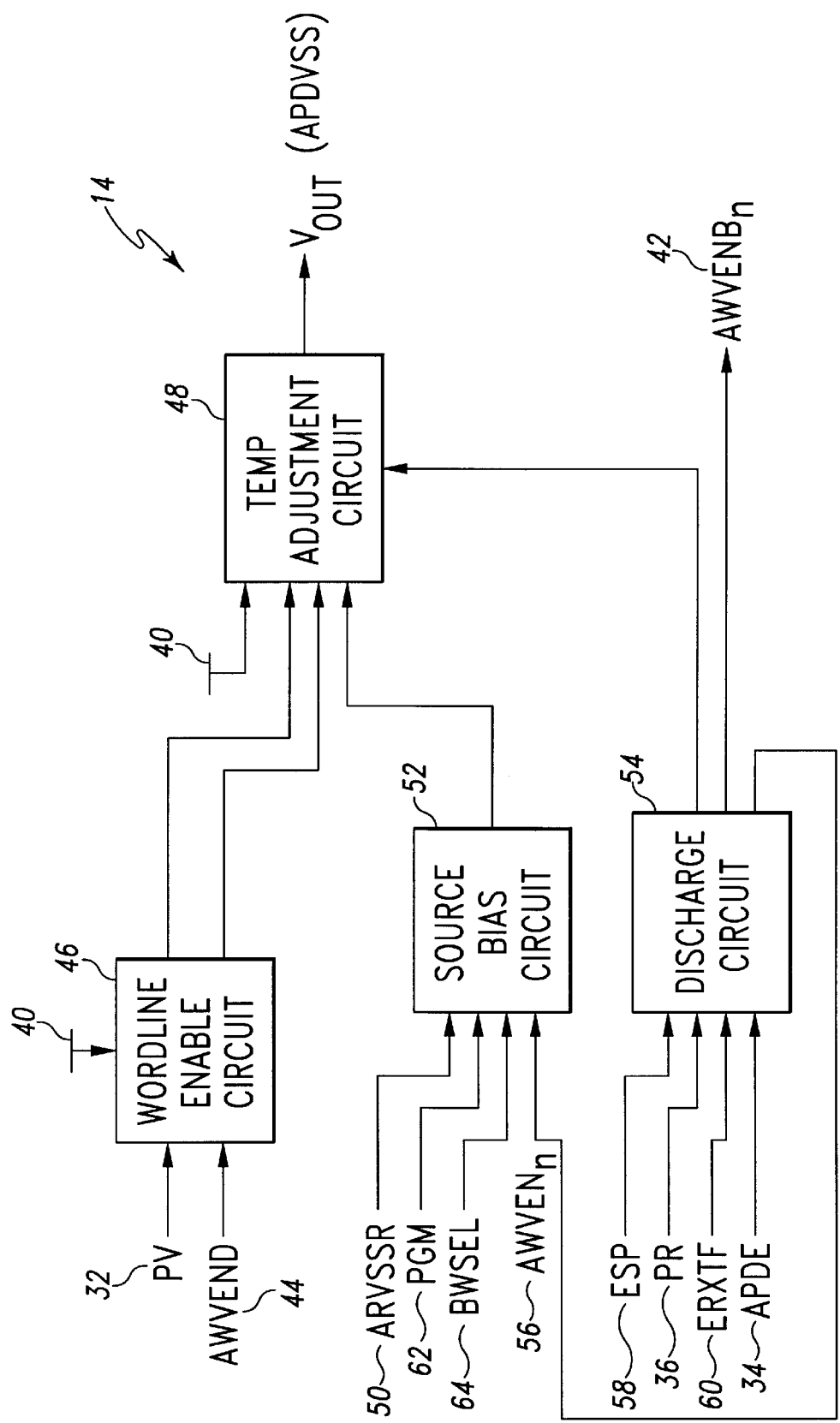
FIG. 3 is a block diagram of a preferred temperature compensated bias voltage circuit.

Referring to FIG. 3, a block diagram of the preferred temperature compensated bias generator circuit 14 is illustrated. For a detailed discussion of the temperature compensated bias generator circuit 14 refer to co-pending and commonly assigned U.S. patent application Ser. No. 09/610,764, entitled "TEMPERATURE COMPENSATED BIAS GENERATOR" to Van Buskirk et al., that was filed on Jul. 6, 2000, and is herein incorporated in it's entirety.

The preferred temperature compensated bias generator circuit 14 includes the wordline enable circuit 46, a temperature adjustment circuit 48, a source bias circuit 52 and a discharge circuit 54. The wordline enable circuit 46 is electrically connected with the temperature adjustment circuit 48. The temperature adjustment circuit 48 is also electrically connected with the source bias circuit 52 and the discharge circuit 54. The discharge circuit 54 is electrically connected with the source bias circuit 52 through an AWVENn line 56. The discharge circuit 54 is also electrically connected with the one shot 28 and the temperature compensation enable circuit 30 of the charge share circuit 12 through the AWVENBn line 42. The regulated power supply 40 is electrically connected with the wordline enable circuit 46 and the temperature adjustment circuit 48 as illustrated.

The Program Verify line 32 from the state machine and the AWVEND line 44, which comes from the temperature compensation enable circuit 30 in the charge share circuit 12, are electrically connected with the wordline enable circuit 46. The Program Reset line 36, the Automatic Program Disturb Erase line 34, an ESP control line 58, and an ERXTF control line 60 are electrically connected with the discharge circuit 54. An ARVSSR source bias 50 line, a PGM control line 62 and a BWSEL control line 64 are electrically connected with the source bias circuit 52. The Program Verify line 32, the Program Reset line 36, the ARVSSR source bias line 50, the ESP control line 58, the ERXTF control line 60, the PGM control line 62 and the BWSEL control line 64 are all controlled by the state machine.

The temperature compensated bias generator circuit 14 is activated by a signal on the AWVEND line 44 that originates from the temperature compensation enable circuit 30 of the charge share circuit 12 and from a signal on the Program Verify line 32 from the state machine. The temperature compensated bias generator circuit 14 supplies the second predetermined voltage for a second predetermined time period to the wordlines 18 in the memory sector 20 during the APDEV operation. The magnitude of the second predetermined voltage is dependent on the operating temperature of the memory device 10 and is equal to the bias voltage.

Once authorized by the wordline enable circuit 46, the temperature adjustment circuit 48 generates the second predetermined voltage. As illustrated in FIG. 1, the second predetermined voltage is directed from the temperature compensated bias generator circuit 14 through the pass gates 16 and then to the wordlines 18. As previously set forth, the second predetermined voltage is generated by the temperature adjustment circuit 48 and varies depending on the temperature of the flash memory 10. Although not illustrated, in the preferred embodiment of the invention, the temperature adjustment circuit 48 includes a resistor chain, the output of which varies with changes in temperature.

The source bias circuit 52 is directed by the AWVENn line 56 and the PGM control line 62 to provide a stress voltage to the wordlines 18 during a stress operation. As known to those skilled in the art, the stress operation is performed following the APDEV operation, the details of which are beyond the scope of the present invention. The discharge circuit 54 is controlled by the state machine with the ESP control line 58, the Program Reset line 36, the ERXTF control line 60 and the Automatic Program Disturb Erase line 34 to initialize an output signal on the AWVENBn line 42 for the charge share circuit 12 as discussed above. The discharge circuit 54 also discharges voltage present on the wordlines 18 to a ground connection (not shown) when activated by the state machine.

Figure 4:
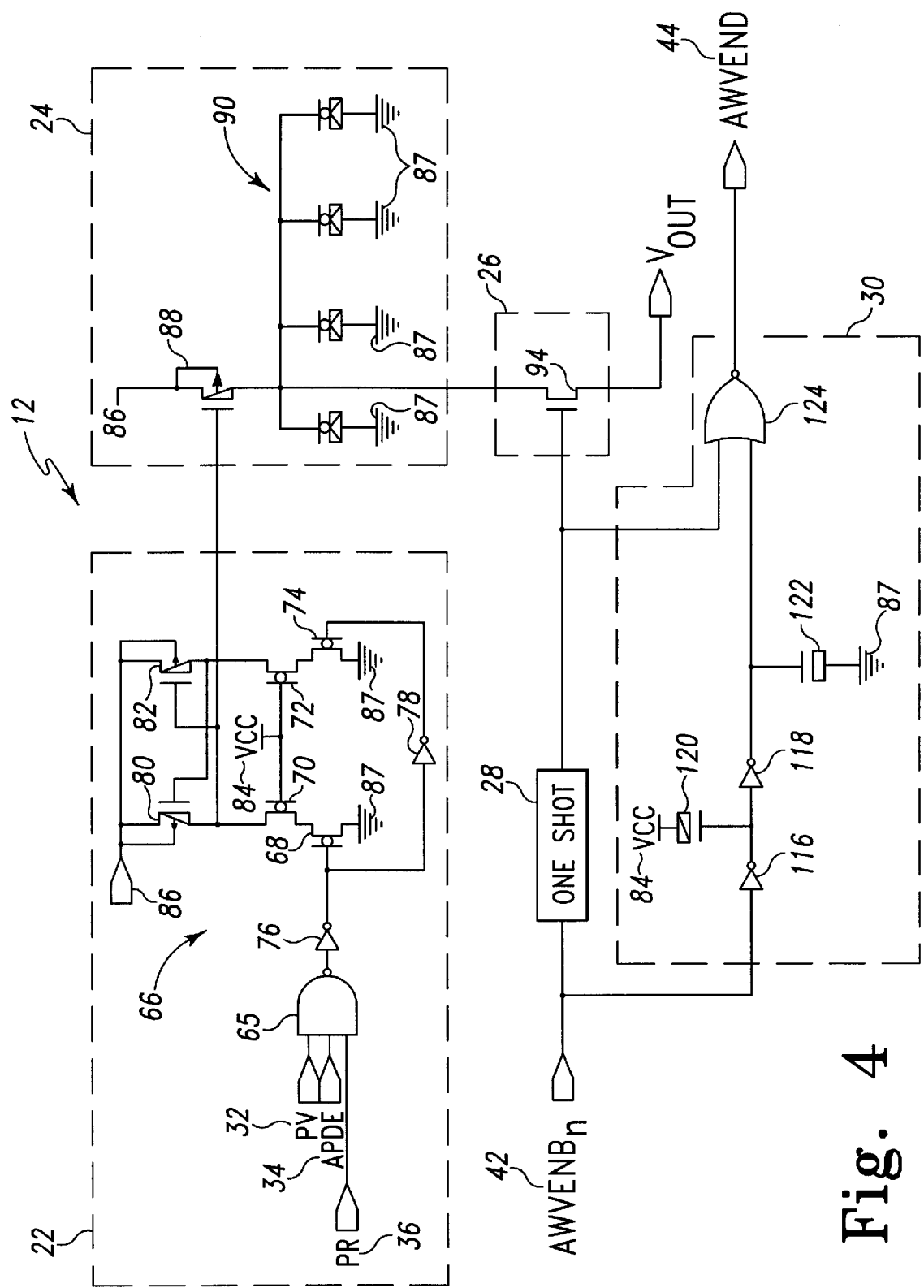
FIG. 4 is a circuit schematic of a preferred charge share circuit.

FIG. 4 illustrates a detailed circuit schematic of a preferred embodiment of the charge share circuit 12 used in the present invention. In the preferred embodiment, the charge enable circuit 22 includes a NAND gate 65 and a level shifter 66. The level shifter 66 includes a plurality of n-channel transistors 68, 70, 72, 74, a first inverter 76, a second inverter 78, a plurality of p-channel transistors 80, 82, a supply voltage (Vcc) connection 84, a regulated power supply connection 86 and a ground connection 87 electrically connected as illustrated in FIG. 4. Those skilled in the art would recognize that variations exist in the design of level shifters and that the level shifter illustrated is by way of example only and should not be construed as a limitation of the present invention.

The output of the charge enable circuit 22 is connected with the capacitor node 24, which includes a p-channel transistor 88 and a plurality of capacitors 90. P-channel transistor 88 is electrically connected with the regulated power supply connection 86 and the capacitors 90. The capacitors 90 are also electrically connected to the ground connection 87. Although the preferred capacitor node 24 is set forth in FIG. 4, those skilled in the art recognize variations exist in the configuration of capacitor nodes. The determination of the amount of energy storage capacity required in the capacitors 90 is known by those skilled in the art to be correlated to the capacitive load of the wordlines 18 to be charged in the memory sector 20.

As further illustrated in FIG. 4, the output of the capacitor node 24 is electrically connected with the storage discharge circuit 26, which comprises an n-channel transistor 94 in the preferred embodiment. The storage discharge circuit 26 is also electrically connected with the output of the one shot 28. The electrical configuration of one shots 28 is known to those skilled in the art and a detailed discussion of the circuit design is not necessary for an understanding of the present invention. Those skilled in the art would recognize that several variations in one shot circuits may be used in the present invention.

The AWVENBn line 42 is electrically connected with the one shot 28 and the temperature compensation enable circuit 30. The temperature compensation enable circuit 30 includes a first inverter 116, a second inverter 118, a p-channel capacitor 120, an n-channel capacitor 122, a NOR gate 124, the ground connection 87, and the supply voltage (Vcc) connection 84 electrically connected as illustrated in FIG. 4. Those skilled in the art would recognize that variations exist on the design of the temperature compensation enable circuit 30 and that the temperature compensation enable circuit 30 illustrated is by way of example only and should not be construed as a limitation of the present invention.

The APDEV operation uses the charge share circuit 12 and the temperature compensated bias generator circuit 14 to charge the wordlines 18 in a respective memory sector 20 to a bias voltage level, which varies with the temperature of the flash memory 10. The charge share circuit 12 provides the first predetermined voltage that charges the wordlines 18 to the base voltage. The temperature compensated bias generator circuit 14 then provides the second predetermined voltage, which is used to charge the wordlines 18 to the bias voltage necessary for the APDEV operation. In the preferred embodiment of the present invention, each memory sector 20 contains 512 individual wordlines 18 that are simultaneously charged by sequential application of the first predetermined voltage and the second predetermined voltage. The number of wordlines illustrated in the preferred embodiment is provided by way of example only and should not be construed as a limitation of the present invention.

Figure 5:
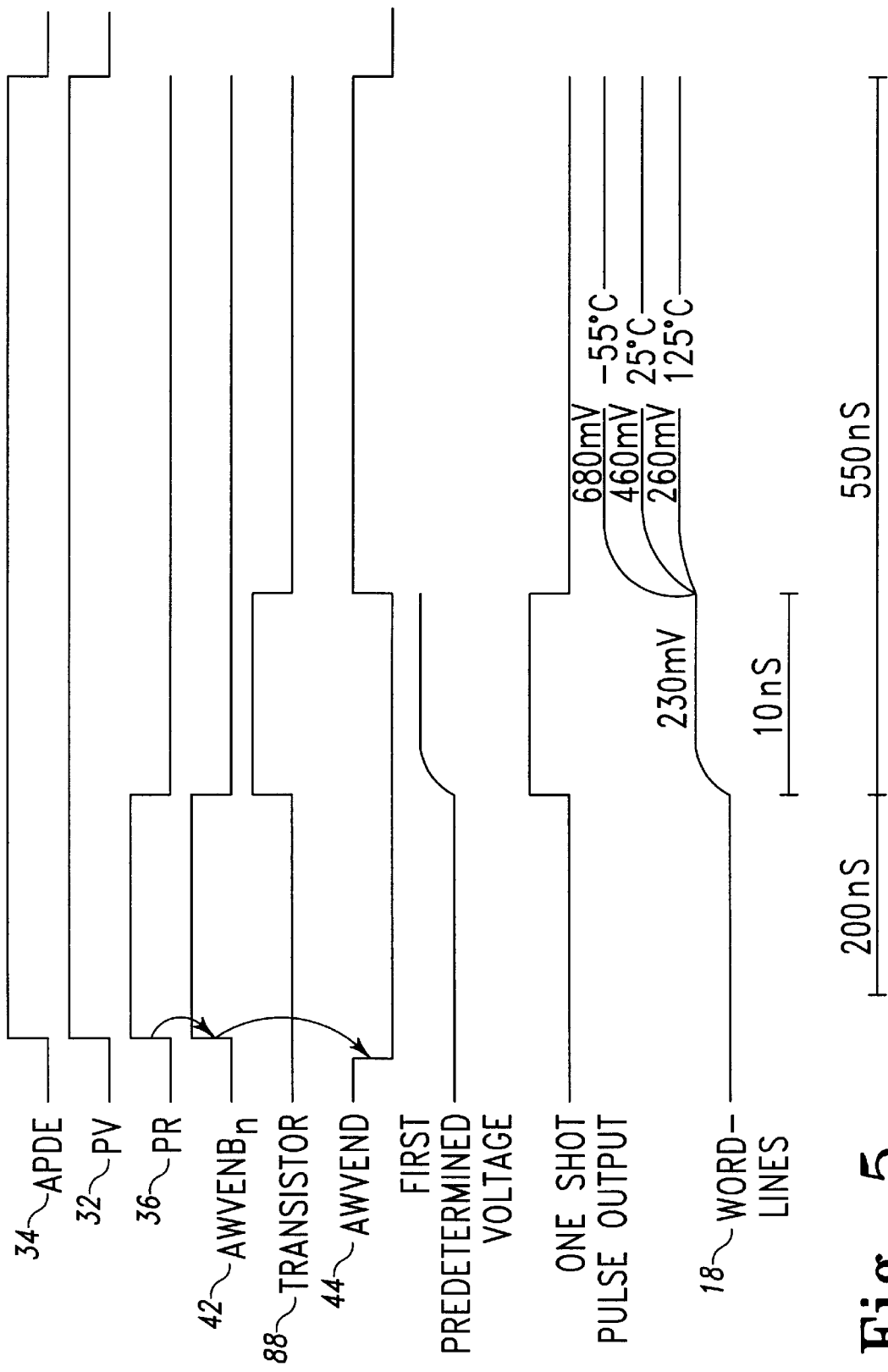
FIG. 5 represents a timing diagram of the charging of the wordlines during the APDEV operation.

As shown in the timing diagram illustrated in FIG. 5, the charge share circuit 12 first charges the wordlines 18 to a base voltage of approximately 230 mV in approximately 10 nanoseconds. The temperature compensated bias generator circuit 14 then charges the wordlines 18 with the second predetermined voltage for approximately 540 nanoseconds. Since the second predetermined voltage is equal to the bias voltage required for the APDEV operation, it is higher than the base voltage already present on the wordlines 18, which comes from the charge share circuit 12. The amount of voltage charged to the wordlines 18 because of the application of the second predetermined voltage by the temperature compensated bias generator circuit 14 is the difference between the base voltage and the second predetermined voltage. When the voltage difference is charged to the wordlines 18, the bias voltage is created on the wordlines 18.

Since the voltage supplied by the temperature compensated bias generator circuit 14 requires a longer time period to charge the wordlines 18, the base voltage supplied by the charge share circuit 12 lowers the total charge time required to achieve the bias voltage on the wordlines 18. Thus, the present invention overcomes the problems associated with charging the wordlines 18 to the bias voltage. The problems are overcome by boosting the wordlines 18 to the base voltage with the charge share circuit 12 before charging the wordlines 18 to the bias voltage with the temperature compensated bias generator circuit 14. As previously set forth, the base voltage is approximately 230 mV in the preferred embodiment; however, those skilled in the art would recognize that a different base voltage value may be used in the present invention.

Referring to the timing diagram illustrated in FIG. 5, a detailed discussion of the APDEV operation and its relation to the present invention illustrated in FIGS. 1–4 will be set forth below. During normal operation, the charge enable circuit 22 of the charge share circuit 12 is initially enabled by the set of control inputs 38 from the state machine. When the control input on the Program Reset line 36 begins conducting (logic "1") for a period of 200 nanoseconds, the level shifter 66 of the charge enable circuit 22 energizes p-channel transistor 88 of the capacitor node circuit 24.

P-channel transistor 88 acts as a transfer gate to allow the regulated power supply connection 86 to charge the plurality of capacitors 90 in the capacitor node 24 to a predetermined voltage level. In the preferred embodiment, the regulated power supply connection 86 is supplied a predetermined supply voltage of about 5 V from the regulated power supply 40 illustrated in FIG. 2.

A signal on the Program Reset line 36 also causes the discharge circuit 54 to direct an output signal on the AWVENBn line 42 to the one shot 28 and the first inverter 116 of the temperature compensation enable circuit 30 in the charge share circuit 12. When the AWVENBn line 42 begins conducting (logic "1"), it has no impact on the one shot 28, but the state of the NOR gate 124 in the temperature compensation enable circuit 30 is changed. The change of state of the NOR gate 124 causes the AWVEND line 44 to stop conducting (logic "0"), thereby disabling the temperature compensated bias generator circuit 14.

When the Program Reset line 36 is disabled by the state machine after 200 nanoseconds, the capacitors 90 are fully charged to the predetermined voltage. The level shifter 66 de-energizes p-channel transistor 88 to disconnect the regulated power supply connection 86 from the capacitors 90. In addition, the discharge circuit 54 disables the signal on the AWVENBn line 42. The one shot 28 in the charge share circuit 12 is enabled by the falling edge of the signal on the AWVENBn line 42 thereby creating an output pulse, which is 10 nanoseconds in the preferred embodiment. The output of the one shot 28 energizes n-channel transistor 94 of the storage discharge circuit 26. N-channel transistor 94 acts as a transfer gate allowing the energy stored in the capacitors 90 to be directed by the pass gates 16 to the wordlines 18 of the memory sector 20, thereby charging the wordlines 18 to the base voltage of 230 mV.

When the 10-nanosecond output pulse from the one shot 28 ends, n-channel transistor 94 is disabled and the capacitors 90 stop charging the wordline 18. In addition, the signal on the AWVEND line 44 begins conducting (logic "1"), thereby causing the wordline enable circuit 46 to enable the temperature compensated bias generator circuit 14. As previously set forth, the operating temperature of the flash memory 10 determines the magnitude of the second predetermined voltage that is generated by the temperature compensated bias generator circuit 14. The temperature/voltage relationship used to develop the second predetermined voltage is almost linear.

When the APDEV operation is complete, the signal on the Program Verify line 32 stops conducting (logic "1"), disabling the charge share circuit 12 and the temperature compensated bias generator circuit 14. Within the temperature compensated bias generator circuit 14, the voltage in the temperature adjustment circuit 48 is discharged to ground. In addition, the bias voltage on the wordlines 18 is discharged by the discharge circuit 54. As previously set forth, the APDEV operation will then repeat as necessary until the cells targeted for erasure have reached an erased state with an appropriate variation in threshold voltage.

The present invention has many advantages, including the ability to use low power supply voltage, the ability to charge the wordlines quickly, and the ability to operate under large variations in temperature. By boosting the wordline voltage to the base voltage with the charge share circuit 12, and subsequently charging the wordlines 18 with the second predetermined voltage from the temperature compensated bias generator circuit 14, the bias voltage required to verify the bitlines during the APDEV operation can be readily achieved in a timely manner.

Improvements in flash memory design have allowed a reduction in the power supply voltage (Vcc) to three volts or less. During the APDEV operation, due to the reduction in the supply voltage (Vcc), the temperature compensated bias generator circuit 14 could not, by itself, charge the wordlines 18 in the memory sector 20 to the bias voltage required within the designated time period. In the preferred embodiment, the designated time period is 550 nanoseconds. Boosting the wordlines 18 to the base voltage with the charge share circuit 12 before applying the voltage generated by the temperature compensated bias generator circuit 14 overcomes this problem. By teaming the voltage generated by charge share circuit 12 with the voltage generated by the temperature compensated bias generator circuit 14, the bias voltage required on the wordlines to verify the bitlines during the APDEV operation can readily be achieved within the desired time.

With presently known methods, the temperature compensated bias generator circuit 14 is capable of charging the wordlines 18 to the bias voltage at temperatures below 125° C. However, at temperatures at or near 125° C., the temperature compensated bias generator circuit 14 cannot, by itself, charge the wordlines 18 to the bias voltage level in the time frame required in current flash memory devices that use low supply voltages (Vcc). The addition of the charge share circuit 12 provides a faster and more efficient method to insure the correct voltage is achieved on the wordlines 18 during the APDEV operation.

While the invention has been described in its currently best known modes of operation and embodiments, other modes and embodiments of the invention will be apparent to those skilled in the art. It is the following claims, including all equivalents that are intended to define the spirit and scope of the invention.

What is claimed is:

1. A method of supplying a predetermined bias voltage to a plurality of wordlines during an APDEV operation in a memory device, comprising the steps of:

generating a first predetermined voltage with a charge share circuit;

charging said wordlines with said first predetermined voltage for a first predetermined time period;

generating a second predetermined voltage with a temperature compensated bias generator circuit; and charging said wordlines with said second predetermined voltage for a second predetermined time period at the conclusion of said first predetermined time period.

2. The method of claim 1, wherein said first predetermined voltage is approximately 230 mV.

3. The method of claim 1, wherein said charge share circuit includes a charge enable circuit, a capacitor node, a storage discharge circuit, a one shot, and a temperature compensation enable circuit.

4. The method of claim 1, wherein said second predetermined voltage is generated based on the operating temperature of said memory device.

5. The method of claim 1, wherein said first predetermined time period is approximately 10 nanoseconds.

6. The method of claim 1, wherein said second predetermined time period is approximately 540 nanoseconds.

7. The method of claim 1, wherein said first and second predetermined voltages are directed to said plurality of wordlines with at least one pass gate electrically connected with said charge share circuit, said temperature compensated bias generator circuit and said wordlines.

8. A method of charging a bias voltage to a plurality of wordlines during an APDEV operation in a memory device, comprising the steps of:

providing a charge share circuit for generating a first predetermined voltage;

directing said first predetermined voltage to a plurality of wordlines until said wordlines are charged to a base voltage level;

providing a temperature compensated bias generator circuit for generating a second predetermined voltage;

directing said second predetermined voltage to said plurality of wordlines once said base voltage level is achieved; and charging said wordlines with said second predetermined voltage until reaching said bias voltage.

9. The method of claim 8, wherein said charge share circuit includes a charge enable circuit, a capacitor node, a storage discharge circuit, a one shot, and a temperature compensation enable circuit.

10. The method of claim 8, wherein said base voltage level is 230 mV.

11. The method of claim 8, wherein said first predetermined voltage is directed to said wordlines for about 10 nanoseconds.

12. The method of claim 8, wherein said second predetermined voltages are directed to said plurality of wordlines by at least one pass gate.

13. The method of claim 8, wherein said second predetermined voltage is directed to said plurality of wordlines for about 540 nanoseconds.

14. The method of claim 8, wherein said second predetermined voltage is generated based on the operating temperature of said memory device.

15. A memory device capable of charging a bias voltage to a plurality of wordlines during an APDEV operation, comprising:

a charge share circuit electrically connected with said wordlines, said charge share circuit generating a first predetermined voltage that is applied to said wordlines for a first predetermined time period;

a temperature compensated bias generator circuit electrically connected with said charge share circuit and said wordlines, said temperature compensated bias generator circuit generating a second predetermined voltage that is applied to said wordlines for a second predetermined time period after said first predetermined time period; and at least one pass gate electrically connected with said charge share circuit, said temperature compensated bias generator circuit and said wordlines for directing said respective first and second predetermined voltages to said wordlines during said respective time periods thereby charging said wordlines to said bias voltage.

16. The memory device of claim 15, wherein said charge share circuit comprises a charge enable circuit, a capacitor node, a storage discharge circuit, a one shot, and a temperature compensation enabling circuit.

17. The memory device of claim 15, wherein said temperature compensated bias generator circuit includes a wordline enabling circuit, a temperature adjustment circuit, a source bias circuit, and a discharge circuit.

18. The memory device of claim 15, wherein said first predetermined voltage is approximately 230 mV.

19. The memory device of claim 15, wherein said second predetermined voltage is generated based on the operating temperature of said memory device.

20. The memory device of claim 15, wherein said second predetermined time period is approximately 540 nanoseconds.

* * * * *